United States Patent
Mordakhay et al.

(10) Patent No.: US 10,574,915 B1
(45) Date of Patent: Feb. 25, 2020

(54) ESTIMATING A TEMPERATURE OF A PIXEL

(71) Applicant: Analog Value Ltd., Rishon Lezion (IL)

(72) Inventors: Anatoli Mordakhay, Hadera (IL); Vladimir Koifman, Rishon Lezion (IL)

(73) Assignee: ANALOG VALUE LTD., Herzliya (IL)

( * ) Notice: Subject to any disclaimer, the term of this patent is extended or adjusted under 35 U.S.C. 154(b) by 0 days.

(21) Appl. No.: 15/791,441

(22) Filed: Oct. 24, 2017

Related U.S. Application Data (60) Provisional application No. 62/569,552, filed on Oct. 8, 2017.

(51) Int. Cl.
| | | |
|---|---|---|
| *H04N 5/361* | (2011.01) | |
| *H04N 5/378* | (2011.01) | |
| *G01K 13/00* | (2006.01) | |
| *G01R 19/10* | (2006.01) | |

(52) U.S. Cl.
CPC ............. *H04N 5/361* (2013.01); *G01K 13/00* (2013.01); *H04N 5/378* (2013.01); *G01R 19/10* (2013.01)

(58) Field of Classification Search
CPC ........ H04N 5/361; H04N 5/378; G01K 13/00; G01R 19/10
See application file for complete search history.

(56) References Cited

U.S. PATENT DOCUMENTS

| | | | | |
|---|---|---|---|---|
| 7,280,139 | B2* | 10/2007 | Pahr | H04N 3/155 348/241 |
| 2004/0099920 | A1* | 5/2004 | Rossi | H04N 5/361 257/448 |
| 2008/0251721 | A1* | 10/2008 | Ueno | G01J 5/08 250/332 |
| 2016/0173794 | A1* | 6/2016 | Beck | H04N 5/361 348/244 |
| 2016/0277691 | A1* | 9/2016 | Jo | H04N 5/365 |

\* cited by examiner

*Primary Examiner* — Timothy J Henn
(74) *Attorney, Agent, or Firm* — Reches Patents (57) ABSTRACT

A method for determining a temperature of a pixel; wherein the method includes supplying, by a current supply circuit and to the pixel, a bias current of a first value during a first period; changing, by the current supply circuit, a value of the pixel bias current to a second value; supplying, by the current supply circuit and to the pixel, a bias current of a second value during a second period; wherein the first value differs from the second value; reading, by a readout circuit that is coupled to the pixel, at a first point of time, a first output voltage of the pixel; wherein the first point in time occurs during the first period or the second period; and reading, by the readout circuit, at a second point of time that differs from the first point in time, a second output voltage of the pixel; wherein the second point in time occurs during the first period or the second period; wherein a difference between the first and second output voltage is indicative of a temperature of the pixel.

19 Claims, 10 Drawing Sheets

ESTIMATING A TEMPERATURE OF A PIXEL

Pixels are used to sense incoming radiation. Non-limiting examples of such pixels include infrared pixels, visible light pixels and various other radiation sensitive pixels.

Some pixels operate in a current mode while some other pixels operate in a voltage mode. A pixel that operates in current mode outputs an output current while a pixel that operates in voltage mode outputs an output voltage.

Pixels that operate in current mode have higher photoresponse variations than pixels that operate in voltage mode—due to local variations of their output device transconductance. Due to these variations, most analog pixels operate at voltage mode although voltage mode is much slower than current mode.

SUMMARY

According to an embodiment of the invention there may be provided a device that may include a pixel, a current supply circuit that is coupled to the pixel, and readout circuit that is coupled to the pixel; wherein the current supply circuit is configured to supply to the pixel a bias current of a first value during a first period, change a value of the pixel bias current to a second value, and supply to the pixel a bias current of a second value during a second period; wherein the first value differs from the second value; wherein the readout circuit is configured to (i) read, at a first point of time, a first output voltage of the pixel, and (ii) read, at a second point of time that differs from the first point in time, a second output voltage of the pixel; wherein a difference between the first and second output voltages is indicative of a temperature of the pixel; wherein the first point in time occurs during the first period or the second period; and wherein the second point in time occurs during the first period or the second period.

The current supply circuit may be configured to change the value of the pixel bias current to the first value at an end of the second period.

The current supply circuit may be configured to change the value of the pixel bias current at substantially the first point of time.

The current supply circuit may be configured to change the value of the pixel bias current at a substantial period before the first point of time.

The substantial period may equal a duration of the second period.

The substantial period may differ from a duration of the second period.

The current supply circuit may include a variable current supply source.

The current supply circuit may include a current supply source and a switch, wherein the switch may be coupled between the current supply source and the pixel; wherein the switch may be configured to selectively disconnect the current supply source to the pixel.

The pixel may include an output transistor and a radiation sensitive element that may be coupled to the output transistor; wherein the readout circuit may be configured to read, during a third period, output signals of the output transistor that may be indicative of radiation sensed by the radiation sensitive element.

The device may include a processor that may be configured to calculate the temperature of the pixel based on the difference between the first and second output voltages.

There may be provided a method for determining a temperature of a pixel; wherein the method may include supplying, by a current supply circuit and to the pixel, a bias current of a first value during a first period; changing, by the current supply circuit, a value of the pixel bias current to a second value; supplying, by the current supply circuit and to the pixel, a bias current of a second value during a second period; wherein the first value may differ from the second value; reading, by a readout circuit that may be coupled to the pixel, at a first point of time, a first output voltage of the pixel; wherein the first point in time occurs during the first period or the second period; and reading, by the readout circuit, at a second point of time that may differ from the first point in time, a second output voltage of the pixel; wherein the second point in time occurs during the first period or the second period; wherein a difference between the first and second output voltages may be indicative of a temperature of the pixel.

The method may include changing, by the current supply circuit, the value of the pixel bias current to the first value at an end of the second period.

The method may include changing, by the current supply circuit, the value of the pixel bias current at substantially the first point of time.

The method may include changing, by the current supply circuit, the value of the pixel bias current at a substantial period before the first point of time.

The substantial period may equal a duration of the second period.

The substantial period may differ from a duration of the second period.

The current supply circuit may include a variable current supply source.

The current supply circuit may include a current supply source and a switch, wherein the switch may be coupled between the current supply source and the pixel; wherein the method may include selectively disconnecting, by the switch, the current supply source to the pixel.

The pixel may include an output transistor and a radiation sensitive element that may be coupled to the output transistor; wherein the method may include reading by the readout circuit, during a third period, output signals of the output transistor that may be indicative of radiation sensed by the radiation sensitive element.

The method may include calculating, by a processor, the temperature of the pixel based on a difference between the first and second output voltages.

The method may include performing image processing that may be responsive to the temperature of the pixel.

The performing of the image processing may include image sensor black level compensation.

There may be provided a device may include a pixel, a bias circuit that may be coupled to the pixel, and a readout circuit that may be coupled to the pixel; wherein the bias circuit may be configured to (i) force a certain pixel output voltage during a first period; (ii) prevent from forcing the certain pixel output voltage during a second period that may differ from the first period; wherein the readout circuit may be configured to (i) read, at a first point of time, a first output voltage of the pixel, and (ii) read, at a second point of time that may differ from the first point in time, a second output voltage of the pixel; wherein a difference between the first and second output voltage may be indicative of a temperature of the pixel.

The bias circuit may be a voltage supply.

The processor may be configured to calculate a temperature of the pixel based on a difference between the first output voltage of the pixel and the second output voltage of the pixel.

The first point in time and the second point in time occur during the second period.

The preventing may include disconnecting the bias circuit from the pixel.

There may be provided a method for determining a temperature of a pixel; wherein the method may include forcing a certain pixel output voltage, by a bias circuit, during a first period; preventing from forcing the certain pixel output voltage during a second period that may differ from the first period; reading, by a readout circuit, at a first point of time, a first output voltage of the pixel; and reading, at a second point of time that may differ from the first point in time and by the readout circuit, a second output voltage of the pixel; wherein a difference between the first and second output voltages may be indicative of a temperature of the pixel.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a device capable of executing the method.

Any reference in the specification to a device should be applied mutatis mutandis to a method that may be executed by the device.

The device may be a sensor, a camera, a communication device, a computer, a monitor, a media player, and the like.

In the following figures there are provided non-limiting examples of sample and buffer circuits and current memory.

Figure 1:
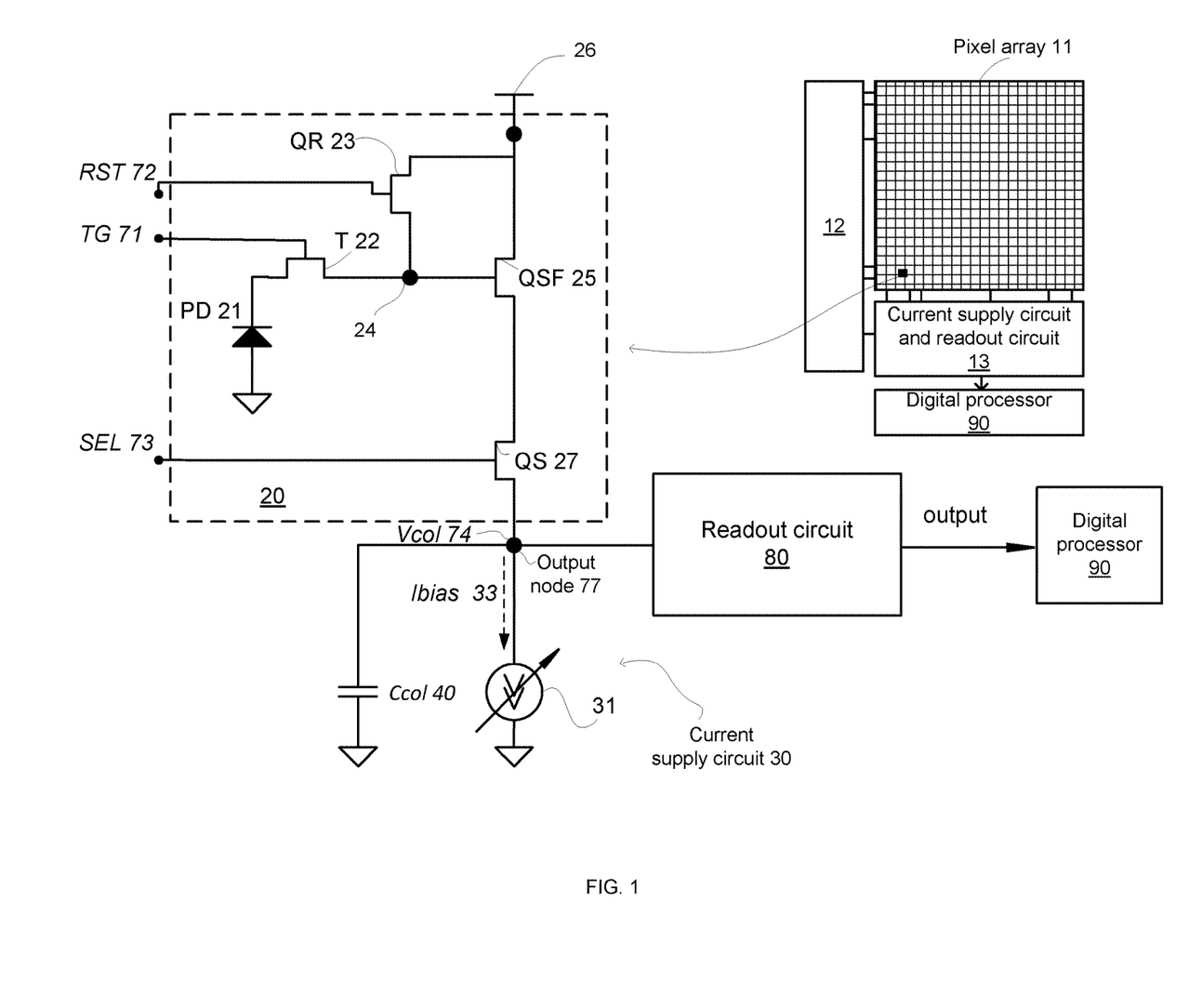
FIG. 1 illustrates an example of a device that includes a pixel and readout circuit.

FIG. 1 illustrates a device 10 that includes an array 11 of pixels, controller 12, current supply circuit and readout circuit that are collectively denoted 13, and digital processor 90.

Array 11 may include one or more pixels. The array 11 may be rectangular, linear, hexagonal, circular, or may have any shape and/or arrangement.

For simplicity of explanation it is assumed that the pixels of the array are arranged in a grid—each column of pixels of the array is coupled to a readout circuit 80 and current supply circuit 30 via an output node of the pixel. Other arrangements may be provided.

FIG. 1 also illustrates a pixel 20. Pixel 20

Device 10 may include any type of pixel. Pixel 20 is a non-limiting example of a pixel. It is termed a 4T pixel as it includes four transistors. Pixel 20 may include three transistors or have more than four transistors.

Pixel 20 includes a radiation sensing element such as a photodiode 21, a transfer gate transistor (T) 22, a reset transistor (QR) 23 a select transistor (QS) 27 and a floating diffusion transistor (QSF) 25.

The gate of transfer gate transistor 22 is fed by transfer gate control signal TG 71.

The gate of reset transistor (QR) 23 is fed by reset signal RST 72.

The gate of select transistor 27 is fed by select signal SEL 73.

The gate of floating diffusion transistor 25 is coupled to a floating diffusion node 24 of pixel 20.

The source of select transistor 27 is coupled to the output node 77 of pixel 20.

Reset transistor 23 and floating diffusion transistor 25 are coupled to a voltage source 26.

The (parasitic) capacitance of the column (that includes pixel 20) is represented by capacitor Ccol 40 that is coupled between output node 77 and the ground.

In FIG. 1 the current supply circuit 30 includes variable current supply source 31.

The variable current supply source 31 is configured to change the value of the pixel bias current is supplies to (or rather drains from) the column, the readout circuit reads at different points of time the output voltage of the pixel (especially—of the column) and digital processor 90 may calculate the temperature of the pixel based on changes in the value of the output voltage.

It should be noted that any transistors in the readout path of the pixel (QSF 25 and/or QS 27) can be used as the temperature sensing devices. The sensing element can be either one of transistors QSF/QS, or the combination of both.

The pixel bias current (also referred to as readout bias current) is switched between two (or more) different values, and the resulting difference in column voltage (Vcol) contains the required information for extraction of pixel temperature.

Figure 7:
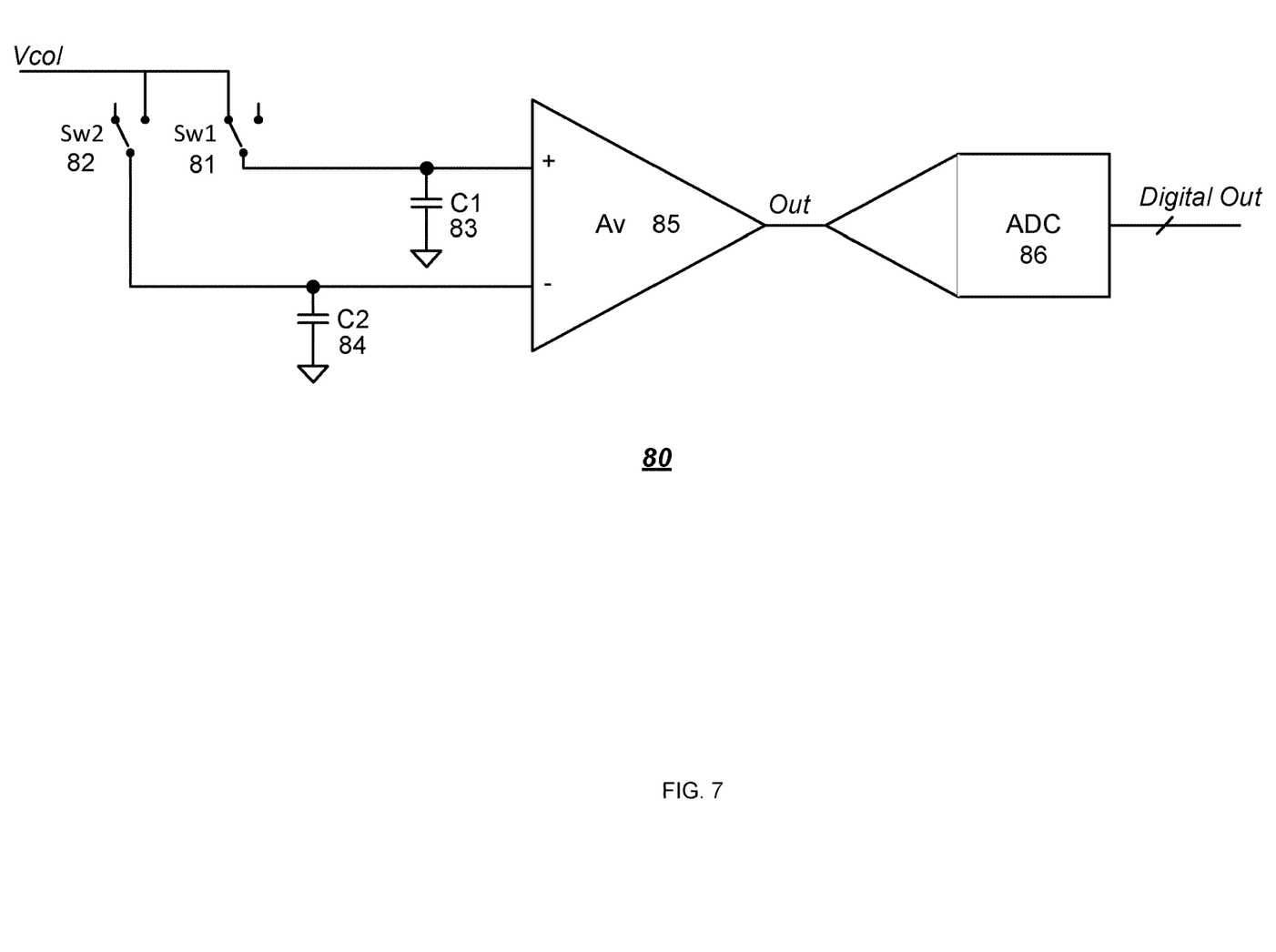
FIG. 7 illustrates an example of a part of a readout circuit.

The signals on Vcol may be read using the same readout circuit used for normal signal readout (normal signal readout—readout used to determine the radiation that impinged on photodiode 21). Vcol value can be sampled onto a different capacitor for each value, or a single capacitor can be used to sample the difference between the two Vcol values. This way a correlated or uncorrelated double sampling can be carried out. The signal may be amplified either before or after sampling. Later on, the signal could be digitized by an ADC. A simplified diagram of a circuit to implement this using either a single capacitor for both samples, or a capacitor per sample is shown in FIG. 7.

The sensing device QS/QSF or the combination of both can operate at either operation region.

In strong inversion its current is given by equation (1):

$$I_D = \mu C_{OX} \frac{W}{2L}(V_{GS} - V_{th})^2(1 + \lambda V_{DS}). \quad (1)$$

Where $\mu$ is the mobility of charge carriers in the channel, $C_{OX}$ is the gate capacitance per unit area, W/L are the device width and length, $V_{GS}$ is the gate-source voltage, and $V_{th}$ is the threshold voltage, and $\lambda V_{DS}$ represent the channel length modulation effect. Assuming $\lambda V_{DS}$ can be neglected, and renaming ($V_{GS}$-$V_{th}$) as $V_{DSsat}$ we get (2):

$$V_{DSsat} = \sqrt{\frac{I_D}{\mu C_{OX} \frac{W}{2L}}} \quad (2)$$

Since both measured values are than at the same temperature, and assuming change in $V_{th}$ due to $V_{SB}$ change is limited, the difference in Vcol, will be equal to the difference in transistor $V_{DSsat}$. Therefore, for a change in current, set by the column bias, we get (3)

$$\Delta V_{DSsat} = \frac{\sqrt{I_{D1}} - \sqrt{I_{D2}}}{\sqrt{\mu C_{OX} \frac{W}{2L}}} \quad (3)$$

As the numerator is set by the bias, and can be kept constant, the temperature dependence is therefore a function of mobility ($\mu$) changes with temperature. This is well defined, and therefore by measuring difference in voltages ($\Delta V_{DSsat}$) temperature of the device can be calculated.

This can also be extended to include higher order effect such as substrate bias change.

If the device(s) are biased to operate in sub-threshold, as similar calculation can be made, with the equation for transistor current replaced with the one for sub-threshold operation (4):

$$I_D = \mu C_{OX} \frac{W}{L}\left(\frac{kT}{q}\right)^2 (n-1)\exp\left(\frac{V_{GS} - V_{th(VBS)}}{nkT}\right)\left(1 - \exp\left(\frac{-qV_{DS}}{kT}\right)\right) \quad (4)$$

Where k is Boltzmanns constant, T is absolute temperature, q is the electron charge, and n is the sub threshold swing coefficient.

Figure 2:
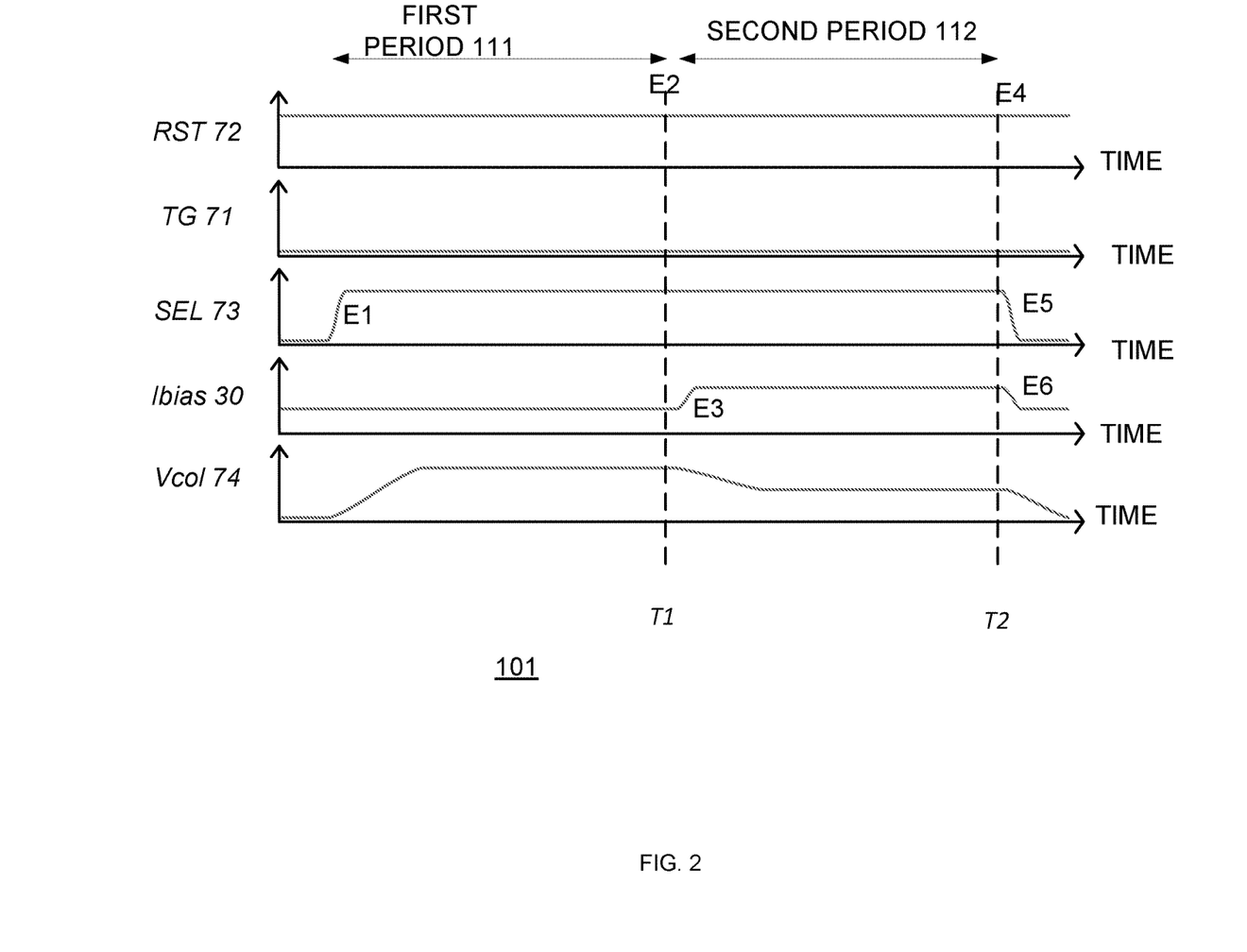
FIG. 2 illustrates an example of a timing diagram.

FIG. 2 is an example of a timing diagram 101 that shows control signals TG 1, RST 72, SEL 73, pixel bias current Ibias 30, and Vcol 74.

The current supply circuit is configured to supply to the pixel a bias current of a first value during a first period 111, change (slightly after first point in time T1) a value of the pixel bias current to a second value, and supply to the pixel a bias current of a second value during a second period 112. The first value differs from the second value.

The readout circuit is configured to (i) read, at first point of time T1, a first output voltage of the pixel (Vcol 74), and (ii) read, at second point of time T2 (that differs from T1), a second output voltage of the pixel (Vcol 74).

In FIG. 1 T1 ends first period 111 and T2 occurs near the end of second period 112.

The operating sequence of FIG. 2 illustrates the following events:

a) E1—The pixel is connected to the column (bitline) by QS controlled from SEL signal.
b) E2—Following the full settling of the column, first value is sampled at readout circuit.
c) E3—Ibias is switched to a different value.
d) E4—Following the full settling of the column, second value is sampled at readout circuit.
e) E5—QS is disconnected by lowering SEL signal.
f) E6—Ibias is switched back to the initial value.

Following E4, the rest of the readout path can commence conversion of the sampled signals.

Following E6, the row address can be changed to sense the following row.

Figure 3:
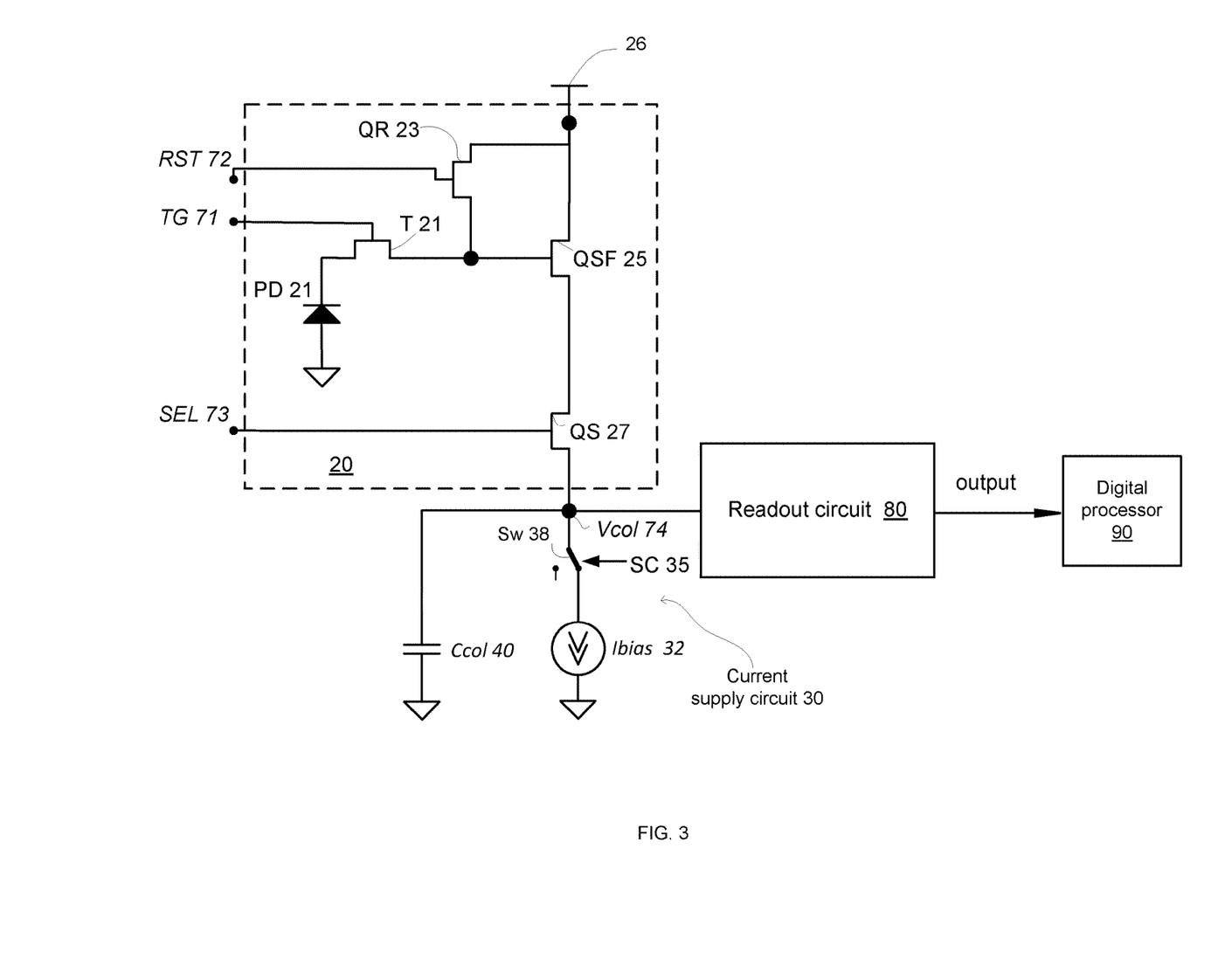
FIG. 3 illustrates an example of a device that includes a pixel and readout circuit.

FIG. 3 illustrates pixel 20 as being coupled to a current supply circuit 30 that includes a current supply source (such as constant current supply source 32) and a switch 38. Switch 38 is controlled by control signal SC 35. Switch is connected between constant current supply source 32 and pixel 20.

Switch 38 is configured to selectively disconnect the current supply source to the pixel. Especially—switch 38 connects the constant current supply source 32 to the pixel during the first period 111 and disconnects the constant current supply source 32 from the pixel during the second period 112.

Accordingly—Ibias can be switched-off or disconnected from the column following the first value sampling. The column voltage (Vcol) will then be pulled up by the pixel transistors (QSF and/or QS), the rate of which will be temperature dependent. A second sample is being taken after a desired time interval. The resulting difference in column voltage (Vcol) contains the required information for extraction of pixel temperature, by using either equation (1), or (4), according to the operating region of the device at the time of sampling.

One possible option is for the signals on Vcol to be read using the same circuit used for normal signal readout. Vcol value can be sampled onto a different capacitor for each value, or a single capacitor can be used to sample the difference between the two Vcol values. This way a correlated or uncorrelated double sampling can be carried out. The signal may be amplified either before or after sampling.

Later on, the signal could be digitized by an ADC. A simplified diagram of a circuit to implement this using either a single capacitor for both samples, or a capacitor per sample is shown in FIG. 7.

Figure 4:
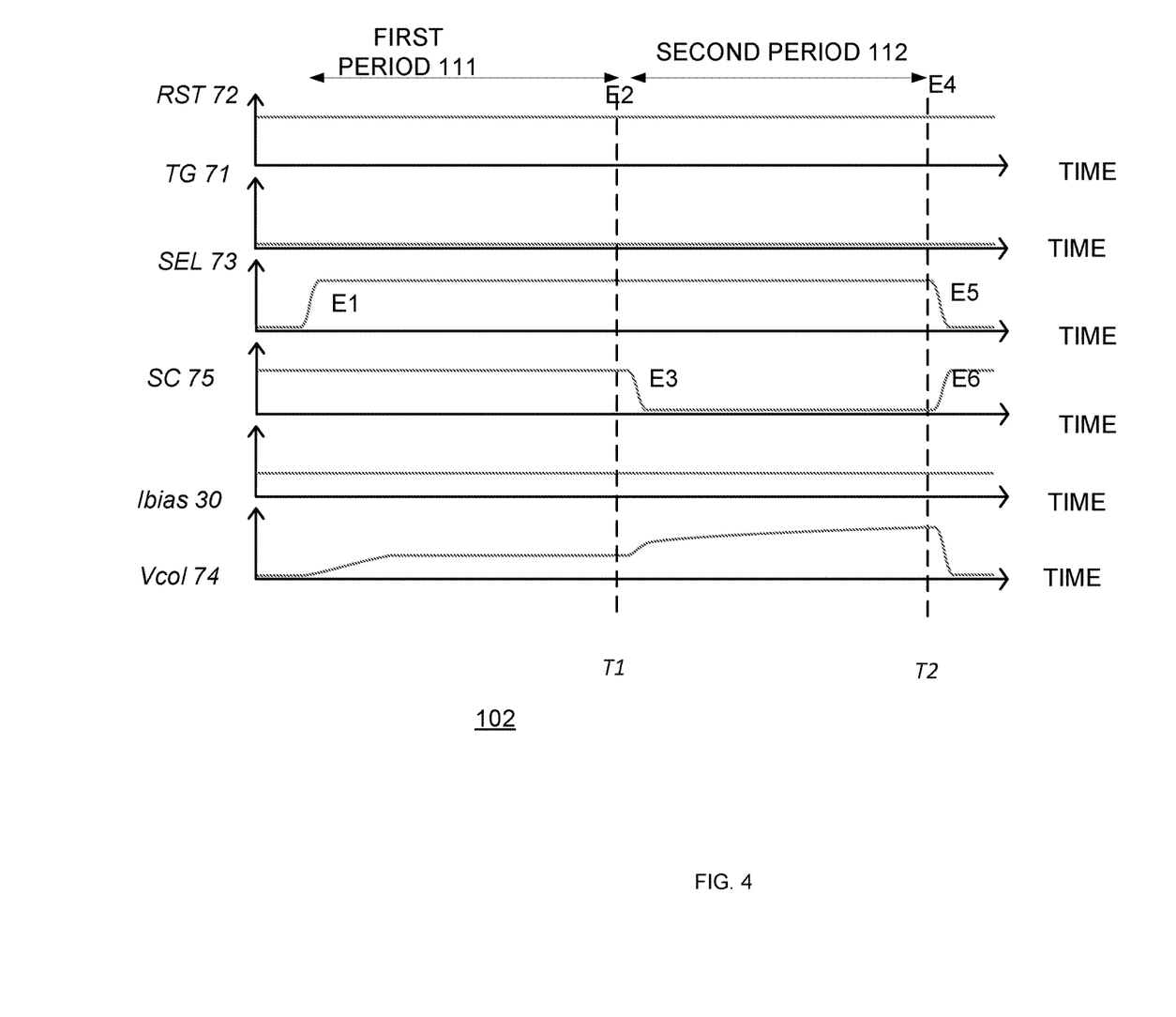
FIG. 4 illustrates an example of a timing diagram.

FIG. 4 is an example of a timing diagram 102. Timing diagram 102 of FIG. 4 differs from the timing diagram 101 of FIG. 1—by having the pixel bias current (from constant current supply source 32) constant—and by showing SC 35 which controls switch 38.

During the second period 112 the switch is open (disconnection) and during the first period 111 the switch is closed (connection).

The operating sequence for the readout is shown in 4 is as follows:
 a) E1—The pixel is connected to the column (bitline) by QS controlled from SEL signal.
 b) E2—Following the full settling of the column, first value is sampled at readout circuit.
 c) E3—Ibias is switched-off or disconnected from the column.
 d) E4—Following a desired time interval, second value is sampled at readout circuit.
 e) E5—QS is disconnected by lowering SEL signal.
 f) E6—Ibias is switched back to the initial value or connected back to column Following E4, the rest of the readout path can commence conversion of the sampled signals.

Following E6, the row address can be changed to sense the following row.

Figure 5:
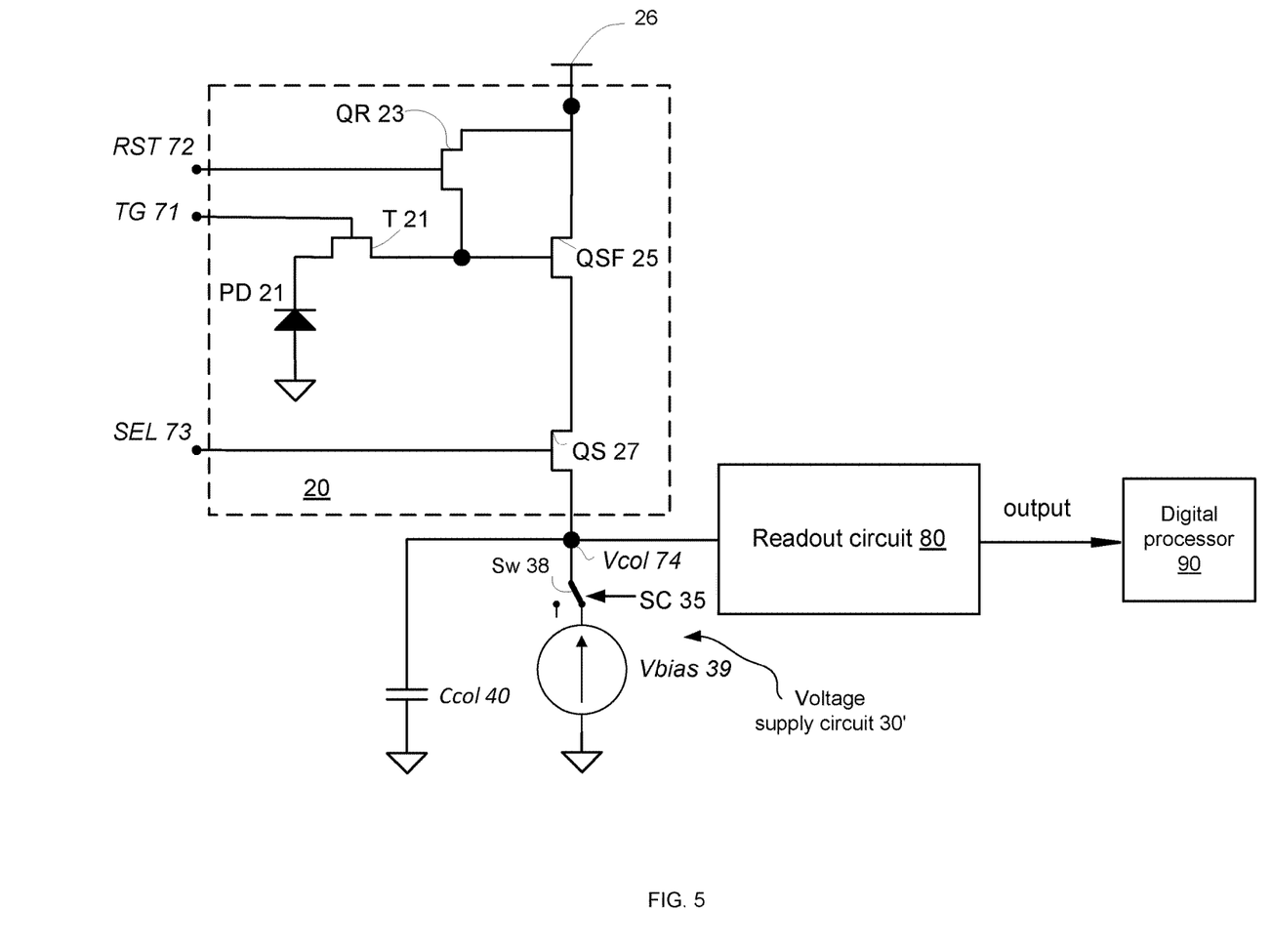
FIG. 5 illustrates an example of a device that includes a pixel and readout circuit.

FIG. 5 illustrates illustrates pixel 20 as being coupled to a voltage supply circuit 30' that includes a voltage supply 39 (such as constant current supply source 32) and a switch 38. Switch 38 is controlled by control signal SC 35. Switch is connected between voltage supply 39 and pixel 20.

Switch 38 is configured to selectively disconnect the voltage supply to the pixel thereby forcing Vcol to a value dictated by voltage supply 39.

The voltage supply may be replaced by a connection to the ground. Alternatively—the voltage supply may provide a bias voltage that has a non-zero value.

The column voltage (Vcol) will then be pulled up by the pixel transistors (QSF and/or QS), the rate of which will be temperature dependent.

Following a desired time interval, the first value of the column voltage Vcol is sampled. A second sample is being taken after a desired time interval. The resulting difference in column voltage (Vcol) contains the required information for extraction of pixel temperature, by using either equation (1), or (4), according to the operating region of the device at the time of sampling.

The desired time interval may be set to any value—especially between hundreds of nanoseconds and tens of nanoseconds—or any other value.

One possible option is for the signals on Vcol to be read using the same circuit used for normal signal readout. Vcol value can be sampled onto a different capacitor for each value, or a single capacitor can be used to sample the difference between the two Vcol values. This way a correlated or uncorrelated double sampling can be carried out. The signal may be amplified either before or after sampling. Later on, the signal could be digitized by an ADC. A simplified diagram of a circuit to implement this using either a single capacitor for both samples, or a capacitor per sample is shown in FIG. 7.

Figure 6:
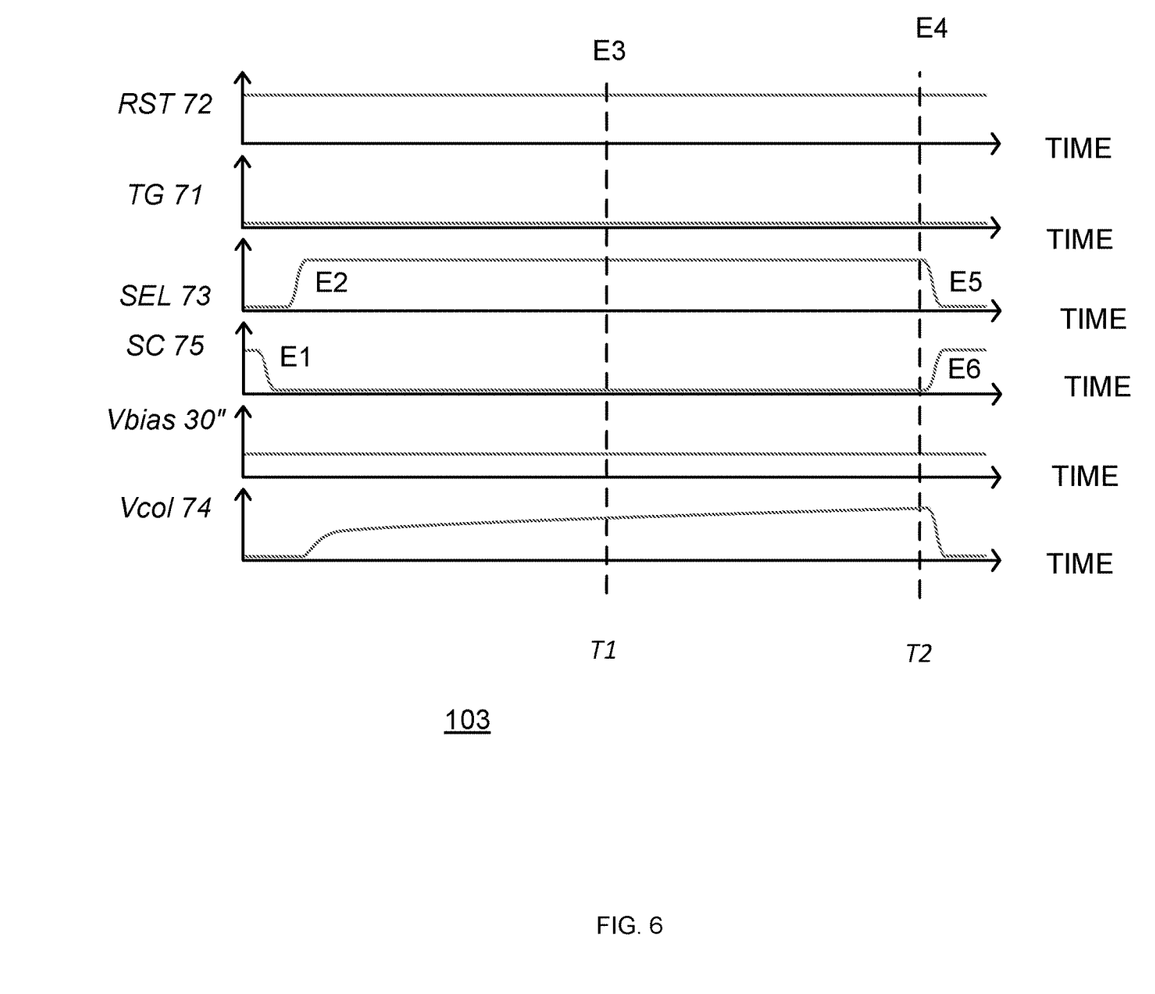
FIG. 6 illustrates an example of a timing diagram.

FIG. 6 is an example of a timing diagram 103. Timing diagram 103 of FIG. 5 differs from the timing diagram 101 of FIG. 1—by having the bias voltage (from voltage supply 39) constant—and by showing SC 35 which controls switch 38.

The operating sequence for the readout is shown in 5 is as follows:
 a) E1—the supply voltage 39 is switched-off or disconnected from the column.
 b) E2—The pixel is connected to the column (bitline) by QS controlled from SEL signal.
 c) E3—Following a desired time interval, first value is sampled at readout circuit.
 d) E4—Following a desired time interval, second value is sampled at readout circuit.
 e) E5—QS is disconnected by lowering SEL signal.
 f) E6—the supply voltage is switched back to the initial value or connected back to column.

Following E4, the rest of the readout path can commence conversion of the sampled signals.

Following E6, the row address can be changed to sense the following row.

FIG. 7 illustrates an example of a part of readout circuit 80.

Readout circuit 80 includes first switch SW1 81, second switch SW2 82, first capacitor C1 83, second capacitor C2 84, amplifier 85, and analog to digital converter (ADC) 86.

SW1 81 and SW2 are coupled (by their input ports) to output node 77. A non-inverting input of amplifier 85 is connected to C1 83 and to an output port of SW1. An inverting input of amplifier 85 is connected to C2 84 and to an output port of SW2.

First switch SW1 81 is closed at the first point of time (and some period of time after T1) thus allowing C1 83 to be charged by the first output voltage of the pixel.

Second switch SW2 82 is closed at the second point of time (and some period of time after T2) thus allowing C2 84 to be charged by the second output voltage of the pixel.

Amplifier 85 measures the difference between the voltages of C1 83 and C2 84 and outputs an analog signal indicative of the difference.

ADC 86 converts the difference to a digital difference.

Figure 8:
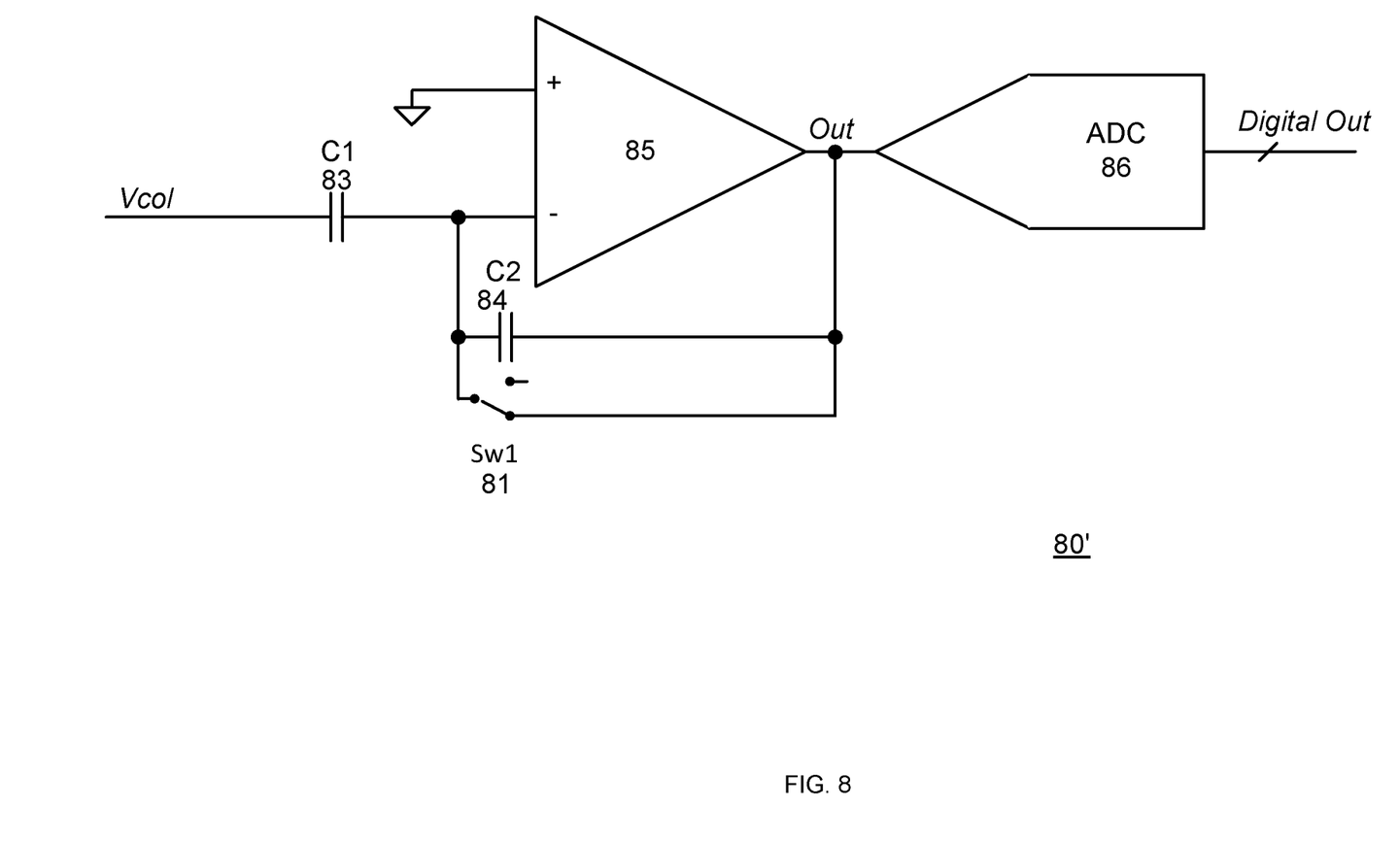
FIG. 8 illustrates an example of a part of a readout circuit.

FIG. 8 illustrates an example of a part of readout circuit 80.

Readout circuit 80 includes first switch SW1 81, first capacitor C1 83, second capacitor C2 84, amplifier 85, and analog to digital converter (ADC) 86.

C1 83 is coupled between output node 77 and another node that is connected to (i) an inverting input of amplifier 85, an input port of SW1 81, and a first end of C2 84.

An output port of amplifier 85 is connected to (i) an input port of ADC 86, a second end of C2 82 and an output port of SW1.

When SW1 is connected then C2 is shortened and when SW1 is disconnected then C2 84 is charged.

When SW1 is shorted, the right side of C1 83 is held at the virtual ground voltage by the amplifier 85. Therefore, the input voltage is sampled onto C1 83, while C2 84 is discharged to 0V.

When SW1 is opened and not conducting—the voltage seen at the inverting input of amplifier 85 is the difference of Vcol values of the first phase and the second phase. This will change the output of the amplifier, which is fed back to the input of the amplifier via C2. The equilibrium point will be when both input terminal of the amplifier are equal.

As a result the amplifier output will equal an amplified version of (Vcol2−Vcol1), with a gain of (−)C1/C2.

Figure 9:
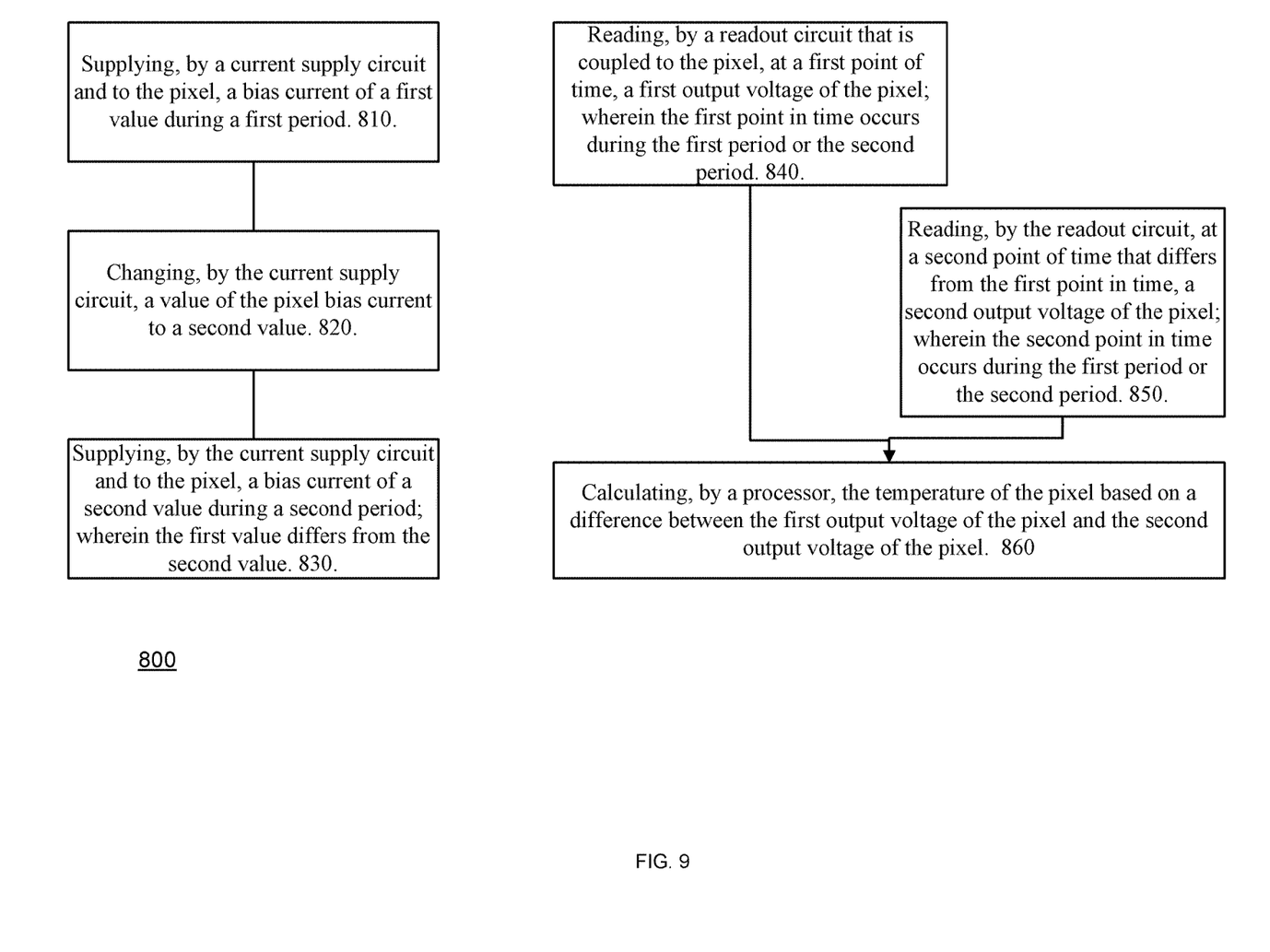
FIG. 9 illustrates an example of a method.

FIG. 9 illustrates method 800.

Method 800 may include the following steps:

a) Supplying, by a current supply circuit and to the pixel, a bias current of a first value during a first period. 810.

b) Changing, by the current supply circuit, a value of the pixel bias current to a second value. 820.

c) Supplying, by the current supply circuit and to the pixel, a bias current of a second value during a second period; wherein the first value differs from the second value. 830.

d) Reading, by a readout circuit that is coupled to the pixel, at a first point of time, a first output voltage of the pixel; wherein the first point in time occurs during the first period or the second period. 840.

e) Reading, by the readout circuit, at a second point of time that differs from the first point in time, a second output voltage of the pixel; wherein the second point in time occurs during the first period or the second period. 850.

f) Calculating, by a processor, the temperature of the pixel based on a difference between the first output voltage of the pixel and the second output voltage of the pixel. 860

Figure 10:
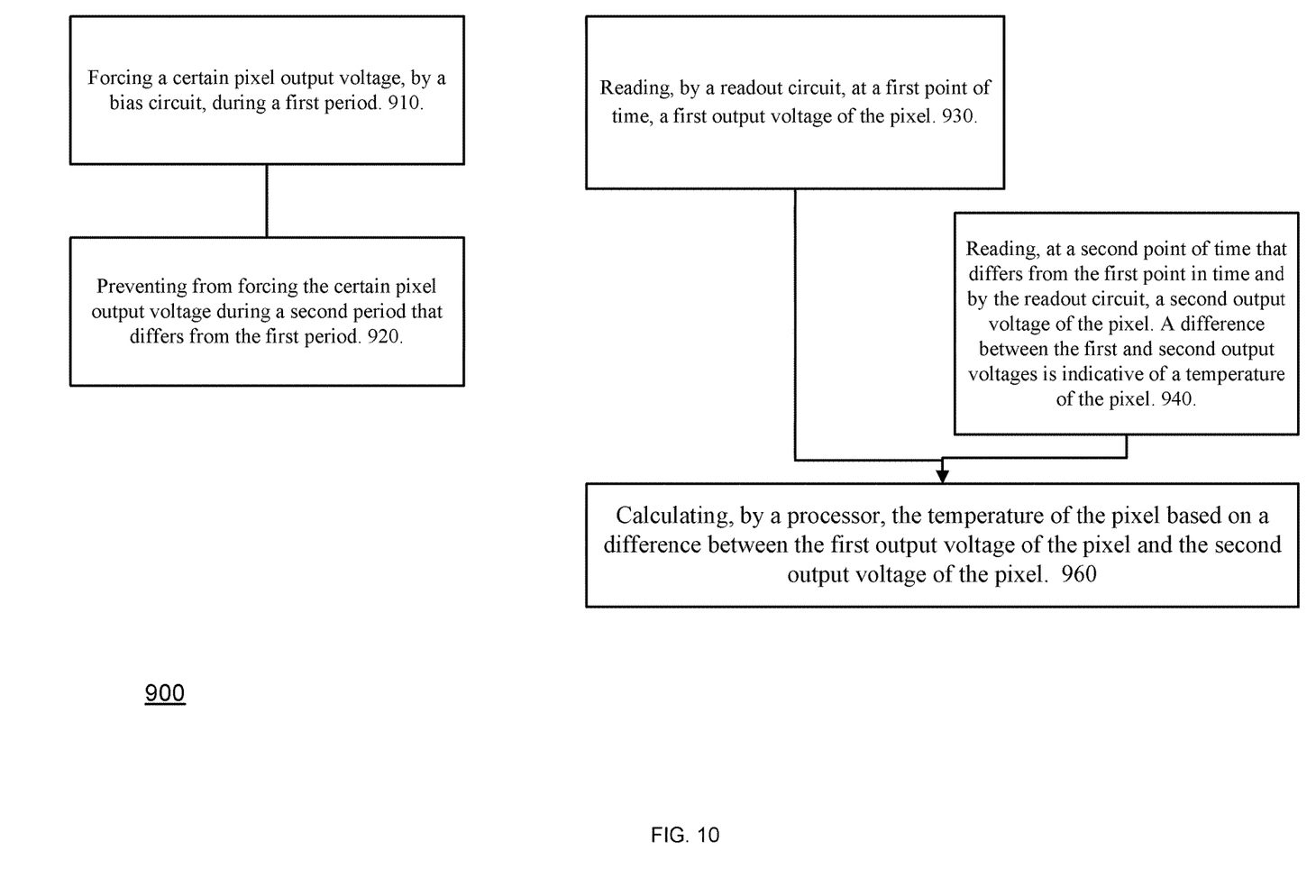
FIG. 10 illustrates an example of a method.

FIG. 10 illustrates method 900.

Method 900 may include the following steps:

a) Forcing a certain pixel output voltage, by a bias circuit, during a first period. 910.

b) Preventing from forcing the certain pixel output voltage during a second period that differs from the first period. 920.

c) Reading, by a readout circuit, at a first point of time, a first output voltage of the pixel. 930.

d) Reading, at a second point of time that differs from the first point in time and by the readout circuit, a second output voltage of the pixel. A difference between the first and second output voltages is indicative of a temperature of the pixel. 940.

e) Determining the temperature of the pixel based on the difference.

It should be noted that there may be a mapping and/or an equation that links the voltage difference to the temperature.

It should be noted that the change in temperature may be monitored—for example even if the exact temperature is not known—the device and/or a method may track changes in the difference (between output voltages)—to evaluate and even compensate for temperature changes. For example—the difference between the output voltages may be monitored in order to detect and/or prevent temperature changes of the pixels—this may involve cooling and/or heating the pixels. Yet for another example, during image processing of images acquired by an array of pixels, the black level of the pixel may be changed based on the temperature. Black level refers to a value outputted by the pixel when no light is sensed by the pixel.

When an array of pixels is provided then the temperature of each pixel of the array may be measured—or only the temperature of some of the pixels may be measured.

It should be noted that there may be any relationship between any of the events illustrated in any of the timing diagrams. Especially—there may be any relationship between the first period and the second period. Yet for another example—events may be proximate to each other, substantially at the same time or substantially different from each other. Substantial may be between few nanometer to few microns, may include deviations by 5% till 95%, and the like.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same common mode noise choke. Alternatively, the examples may be implemented as any number of separate integrated circuits or separate common mode noise chokes interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

Any reference to the term "comprising" or "having" should be interpreted also as referring to "consisting" of "essentially consisting of". For example—a device that comprises certain components can include additional components, can be limited to the certain components or may include additional components that do not materially affect the basic and novel characteristics of the device—respectively.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A device comprising a pixel, a current supply circuit that is coupled to the pixel, and readout circuit that is coupled to the pixel;
   wherein the current supply circuit is configured to supply to the pixel a bias current of a first value during a first period, change a value of the pixel bias current to a second value, and supply to the pixel a bias current of a second value during a second period; wherein the first value differs from the second value;
   wherein the readout circuit is configured to (i) read, at a first point of time, a first output voltage of the pixel, and (ii) read, at a second point of time that differs from the first point in time, a second output voltage of the pixel; wherein a difference between the first and second output voltages is indicative of a temperature of the pixel;
   wherein the first point in time occurs during the first period or the second period;
   wherein the second point in time occurs during the other of the first period or the second period.

2. The device according to claim 1, wherein the current supply circuit is configured to change the value of the pixel bias current to the first value at an end of the second period.

3. The device according to claim 1, wherein the current supply circuit is configured to change the value of the pixel bias current at substantially the first point of time.

4. The device according to claim 1, wherein the current supply circuit is configured to change the value of the pixel bias current at a substantial period before the first point of time.

5. The device according to claim 4, wherein the substantial period equals a duration of the second period.

6. The device according to claim 4, wherein the substantial period differs from a duration of the second period.

7. The device according to claim 1, wherein the current supply circuit comprises a variable current supply source.

8. The device according to claim 1, wherein the current supply circuit comprises a current supply source and a switch, wherein the switch is coupled between the current supply source and the pixel; wherein the switch is configured to selectively disconnect the current supply source to the pixel.

9. The device according to claim 1, wherein the pixel comprises an output transistor and a radiation sensitive element that is coupled to the output transistor; wherein the readout circuit is configured to read, during a third period, output signals of the output transistor that are indicative of radiation sensed by the radiation sensitive element.

10. A method for determining a temperature of a pixel; wherein the method comprises:
    supplying, by a current supply circuit and to the pixel, a bias current of a first value during a first period;
    changing, by the current supply circuit, a value of the pixel bias current to a second value;
    supplying, by the current supply circuit and to the pixel, a bias current of a second value during a second period; wherein the first value differs from the second value;
    reading, by a readout circuit that is coupled to the pixel, at a first point of time, a first output voltage of the pixel; wherein the first point in time occurs during the first period or the second period; and
    reading, by the readout circuit, at a second point of time that differs from the first point in time, a second output voltage of the pixel; wherein the second point in time occurs during the other of the first period or the second period; wherein a difference between the first and second output voltages is indicative of a temperature of the pixel.

11. The method according to claim 10, comprising changing, by the current supply circuit, the value of the pixel bias current to the first value at an end of the second period.

12. The method according to claim 10, comprising changing, by the current supply circuit, the value of the pixel bias current at substantially the first point of time.

13. The method according to claim 10, comprising changing, by the current supply circuit, the value of the pixel bias current at a substantial period before the first point of time.

14. The method according to claim 10, wherein the current supply circuit comprises a variable current supply source.

15. The method according to claim 10, wherein the current supply circuit comprises a current supply source and a switch, wherein the switch is coupled between the current supply source and the pixel; wherein the method comprises selectively disconnecting, by the switch, the current supply source to the pixel.

16. The method according to claim 10, wherein the pixel comprises an output transistor and a radiation sensitive element that is coupled to the output transistor; wherein the method comprises reading by the readout circuit, during a third period, output signals of the output transistor that are indicative of radiation sensed by the radiation sensitive element.

17. The method according to claim 10, comprising calculating, by a processor, the temperature of the pixel based on a difference between the first and second output voltages.

18. The method according to claim 10, comprising performing image processing that is responsive to the temperature of the pixel.

19. The method according to claim 18, wherein the performing of the image processing comprises image sensor black level compensation.

* * * * *